(12) United States Patent
Schmitt-Weaver et al.

(10) Patent No.: US 9,971,251 B2
(45) Date of Patent: May 15, 2018

(54) LITHOGRAPHY SYSTEM AND A MACHINE LEARNING CONTROLLER FOR SUCH A LITHOGRAPHY SYSTEM

(71) Applicant: ASML Netherlands B.V., Veldhoven (NL)

(72) Inventors: Emil Peter Schmitt-Weaver, Veldhoven (NL); Wolfgang Henke, Veldhoven (NL); Thomas Leo Maria Hoogenboom, Veldhoven (NL); Pavel Izikson, Veldhoven (NL); Paul Frank Luehrmann, Veldhoven (NL); Daan Maurits Slotboom, Veldhoven (NL); Jens Staecker, Veldhoven (NL); Alexander Ypma, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 45 days.

(21) Appl. No.: 14/905,611

(22) PCT Filed: Aug. 6, 2014

(86) PCT No.: PCT/EP2014/066919
§ 371 (c)(1),
(2) Date: Jan. 15, 2016

(87) PCT Pub. No.: WO2015/024783
PCT Pub. Date: Feb. 26, 2015

(65) Prior Publication Data
US 2016/0170311 A1 Jun. 16, 2016

Related U.S. Application Data (60) Provisional application No. 61/891,254, filed on Oct. 15, 2013, provisional application No. 61/867,992, filed on Aug. 20, 2013.

(51) Int. Cl.
*G03B 27/42* (2006.01)
*G03F 7/20* (2006.01)

(52) U.S. Cl.
CPC ...... *G03F 7/70516* (2013.01); *G03F 7/70491* (2013.01); *G03F 7/70525* (2013.01); *G03F 7/70625* (2013.01); *G03F 7/70633* (2013.01)

(58) Field of Classification Search
CPC ......... H01L 22/26; H01L 22/12; H01L 22/20; H01L 21/67253; H01L 21/67248;
(Continued)

(56) References Cited

U.S. PATENT DOCUMENTS 6,368,883 B1 4/2002 Bode et al.
6,979,522 B2 12/2005 Hommen et al.
(Continued)

OTHER PUBLICATIONS

International Search Report and Written Opinion dated Oct. 14, 2014 in corresponding International Patent Application No. PCT/EP2014/066919.
(Continued)

*Primary Examiner* — Mesfin Asfaw
(74) *Attorney, Agent, or Firm* — Pillsbury Winthrop Shaw Pittman LLP (57) ABSTRACT

A lithography system configured to apply a pattern to a substrate, the system including a lithography apparatus configured to expose a layer of the substrate according to the pattern, and a machine learning controller configured to control the lithography system to optimize a property of the pattern, the machine learning controller configured to be trained on the basis of a property measured by a metrology unit configured to measure the property of the exposed pattern in the layer and/or a property associated with exposing the pattern onto the substrate, and to correct lithography system drift by adjusting one or more selected from: the lithography apparatus, a track unit configured to apply the layer on the substrate for lithographic exposure, and/or a control unit configured to control an automatic substrate flow among the track unit, the lithography apparatus, and the metrology unit.

21 Claims, 4 Drawing Sheets

(58) Field of Classification Search
CPC .. G03F 7/70633; G03F 7/705; G03F 7/70525; G03F 7/70616; G03F 7/70466; G03F 1/84; G01B 2210/56
See application file for complete search history.

(56) References Cited

U.S. PATENT DOCUMENTS

| | | |
|---|---|---|
| 7,076,320 B1 | 6/2006 | Phan et al. |
| 7,239,368 B2 | 7/2007 | Oesterholt et al. |
| 7,875,851 B1 | 1/2011 | Haidinyak et al. |
| 2002/0193902 A1* | 12/2002 | Shanmugasundram ................... B24B 49/18 700/121 |
| 2004/0159397 A1 | 8/2004 | Bode et al. |
| 2006/0114436 A1 | 6/2006 | Oesterholt et al. |

OTHER PUBLICATIONS

Emil Schmitt-Weaver et al., "Overlay Improvements Using a Real Time Machine Learning Algorithm," Proc. of SPIE, vol. 9050, pp. 90501S-1-90501S-7 (2014).
Israeli Office Action dated May 9, 2017 in corresponding Israeli Patent Application No. 235424.
Israeli Office Action dated Dec. 21, 2017 in corresponding Israeli Patent Application No, 233914.

\* cited by examiner

LITHOGRAPHY SYSTEM AND A MACHINE LEARNING CONTROLLER FOR SUCH A LITHOGRAPHY SYSTEM

CROSS-REFERENCE TO RELATED APPLICATIONS

This application is the U.S. national phase entry of PCT patent application no. PCT/EP2014/066919, which was filed on Aug. 6, 2014, which claims the benefit of priority of U.S. provisional application No. 61/867,992, which was filed on Aug. 20, 2013, and also of U.S. provisional application No. 61/891,254, which was filed on Oct. 15, 2013, and which are incorporated herein in their entirety by reference.

BACKGROUND

The present description relates a lithography system configured to apply a pattern to a substrate, the system comprising, e.g.: a track unit configured to apply a layer on the substrate for lithographic exposure, a lithography apparatus configured to expose the layer according to the pattern, a metrology unit configured to measure a property of the exposed pattern in the layer, a control unit configured to control an automatic substrate flow among the track unit, the lithography apparatus, and the metrology unit, and a machine learning controller configured to control the system to optimize the property of the pattern.

An example of such a lithography system is known from U.S. Pat. No. 6,979,522. In the system of U.S. Pat. No. 6,979,522, a lot (also called a "batch") of substrates is exposed after alignment in a lithography apparatus wherein alignment parameters are determined. Using a formula with tool specific coefficients, the overlay accuracy can be calculated (predicted) from these alignment parameters in advance. Next, the exposure tool-offset can be adjusted on a substrate-to-substrate basis to correct for the derived overlay inaccuracy. Moreover, the alignment parameters for a specific substrate can be used to change the tool-offset for the same substrate prior to exposure.

SUMMARY

A potential disadvantage of the foregoing lithography system is that the machine learning controller may not be effective in correcting system drift. The known system has a controller that is non-optimal in keeping system drift from interfering with data used to calculate accuracy. A linear formula with tool specific coefficients may not be diverse enough to properly characterize all external and internal elements that affect accuracy (for example, the substrate chuck used for exposure, dynamic behavior of the system over time, etc.). It predicts overlay for an individual substrate on the basis of alignment parameters (pre-exposure alignment data) and applies an overlay offset correction on the basis of that prediction. The prediction may not be reliable because there is a mix up of real-time (random, substrate-to-substrate varying) parameters with systematic drift parameters.

It is an objective, for example, to alleviate at least part of a disadvantage of a known lithography system.

According to an embodiment, there is provided a lithography system configured to apply a pattern to a substrate, comprising: a track unit configured to apply a layer on the substrate for lithographic exposure; a lithography apparatus configured to expose the layer according to the pattern; a metrology unit configured to measure a property of the exposed pattern in the layer; a control unit configured to control an automatic substrate flow among the track unit, the lithography apparatus, and the metrology unit; and a machine learning controller configured to control the lithography system to optimize a property of the pattern, the machine learning controller configured to be trained on the basis of the measured property and to correct lithography system drift by adjusting one or more selected from: the lithography apparatus, the track unit and/or the control unit.

According to an embodiment, there is provided a lithography system having a machine learning controller configured to be trained on the basis of a measured property and to correct lithography system drift by adjusting at least one selected from: the lithography apparatus, the track unit and/or the control unit. In this way the correction of the system is based on an accurate measurement of the pattern which is the desired output. The machine learning is based on accurate post-exposure measurement data of the desired output (the pattern, for example overlay, imaging parameters such as a critical dimension) which is a good basis for correcting system drift.

In an embodiment, the machine learning controller is configured to correct lithography system drift on the basis of measured properties of substrates of at least two lots (or more lots) of substrates. A lot comprises at least two substrates, but generally ten or more substrates. Such a sequence may allow for an accurate monitoring of system drift.

According to an embodiment, the machine learning controller comprises a first controller configured to generate an overlay control signal to control overlay between pattern layers. The machine learning controller may correct overlay system drift by adjusting the lithography apparatus, the track unit and/or the control unit on the basis of the overlay control signal. This may yield a lithography system having an optimal control of overlay.

According to an embodiment, the machine learning controller comprises a second controller configured to generate a critical dimension control signal to control a critical dimension of the pattern. The machine learning controller may correct critical dimension system drift by adjusting the lithography apparatus, the track unit and/or the control unit on the basis of the critical dimension control signal. This may yield a lithography system having an optimal control of critical dimension.

According to an embodiment, the machine learning controller comprises both the first controller and the second controller. The machine learning controller may generate an edge-to-edge control signal which is a combination of the overlay control signal and the critical dimension control signal. Accurate edge-to-edge control is desirable in complementary lithography where one-dimensional grating lines are exposed with immersion lithography and the two-dimensional shape is generated by putting so-called "cuts" on these lines to define line ends. These "cuts" may be exposed using extreme ultraviolet (EUV) radiation lithography or with multiple exposures using immersion lithography (generally using deep ultraviolet radiation). It is noted that edge-to-edge variation is not controlled directly. The edge-to-edge error is the result of an overlay error and a critical dimension error. Thus, edge-to-edge error control involves a combination of the mentioned overlay and critical dimension (or another imaging parameter, e.g., a focus parameter) control signals.

According to an embodiment, the first and/or second controller comprises (a) sub-controller(s) configured to generate (a) drift control signal(s) and/or (a) sub-controller(s)

configured to generate (a) real-time (relating to a random or substrate-to-substrate varying parameter) control signal(s). In an embodiment, the training signal for the sub-controller for the real-time control signal may have the theoretical computed influence of systematic drift removed from the training signal before training the real time controller.

The drift control signal(s) may be based on a measured property (post-exposure information). In an embodiment, the drift control signal(s) may also be based on pre-exposure information such as lithography apparatus information, substrate process information and/or plant information. Similarly, the real-time control signal(s) may be based on pre-exposure information.

The lithography apparatus information may include at least one selected from: information about a substrate chuck of the lithography apparatus used for exposure, information about the dynamics of a patterning device support of the lithography apparatus, information about the dynamics of a substrate stage of the lithography apparatus, information about the substrate alignment, information about the substrate leveling, information about an optical property of a projection system of the lithography apparatus, and/or information about a parameter or property associated with exposing the pattern of the patterning device onto a substrate.

The substrate process information may include at least one selected from: spin coating information, baking information, etching information and/or the sequence of the substrate in the lot of substrates.

The plant information may include environmental data comprising at least one selected from: temperature in the plant and/or humidity in the plant.

According to an embodiment, the machine learning controller generates an edge-to-edge control signal which is a combination of (an) overlay control signal(s) [desirably including both a drift and real-time overlay control signal] and (a) critical dimension control signal(s) [desirably including both a drift and real-time critical dimension control signal]. The machine learning controller may correct system drift by adjusting at least selected from: the lithography apparatus, the track unit and/or the control unit, on the basis of the edge-to-edge control signal.

According to an embodiment, there is provided a machine learning controller and a machine learning computer algorithm configured to control the lithography system.

According to an embodiment, there is provided a machine learning controller configured to control a lithography system to optimize a property of a pattern to be applied to a substrate, the machine learning controller configured to be trained on the basis of the property measured by a metrology unit configured to measure the property of the exposed pattern in the layer, and to correct lithography system drift by adjusting one or more selected from: a lithography apparatus configured to expose a layer of the substrate according to the pattern, a track unit configured to apply the layer on the substrate for lithographic exposure, and/or a control unit configured to control an automatic substrate flow among the track unit, the lithography apparatus, and the metrology unit.

According to an embodiment, there is provided a method, comprising: exposing a layer of a substrate according to a pattern using a lithography apparatus of a lithography system; measuring a property of the exposed pattern in the layer using a metrology unit of the lithography system; training a machine learning controller on the basis of the measured property; and controlling the lithography system to optimize a property of the pattern using the machine learning controller by correcting lithography system drift by adjusting one or more selected from: the lithography apparatus, a track unit configured to apply the layer on the substrate for lithographic exposure, and/or a control unit configured to control an automatic substrate flow among the track unit, the lithography apparatus, and the metrology unit.

The machine learning controller may be provided with known artificial intelligence.

BRIEF DESCRIPTION OF THE FIGURES

Embodiments of the invention will now be described, by way of example only, with reference to the accompanying drawings in which.

DETAILED DESCRIPTION

Figure 1:
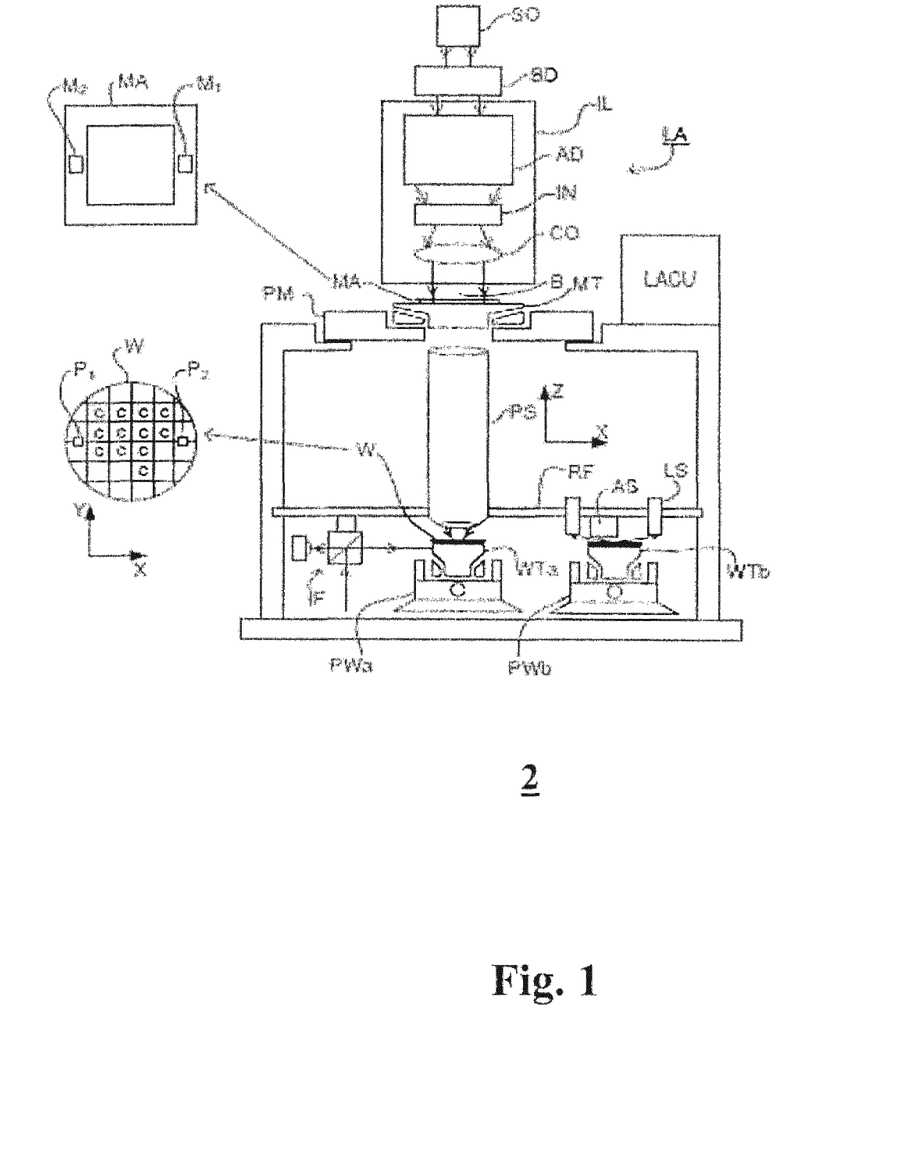
FIG. 1 depicts a lithographic apparatus which may be part of a lithography system according to an embodiment of the invention.

FIG. 1 schematically depicts a lithographic apparatus (2) (that may be part of the lithography system (4)) that comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist coated wafer) W and connected to a second positioner PWa or PWb configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure, which may be a reticle table or reticle chuck, holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. An embodiment of the invention disclosed herein can be used in a stand-alone fashion, but in particular it may provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. The illuminator IL may comprise an adjuster AD for adjusting the angular intensity distribution of the radiation beam. Generally, at least the outer and/or inner radial extent (commonly referred to as -outer and -inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PWa/PWb and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PWa/PWb. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies. The depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Lithographic apparatus LA is of a so-called dual stage type which has two tables WTa and WTb and two stations—an exposure station and a measurement station—between which the tables can be exchanged. In an embodiment, each of the two tables WTa and WTb is a substrate table. In an embodiment, one of the tables WTa, WTb is a substrate table and another table WTa, WTb is a measurement table which does not hold a substrate. While a substrate on a substrate table WTa, WTb is being exposed at the exposure station, a measurement table WTa, WTb or another substrate on another substrate table WTa, WTb is at the measurement station so that various preparatory steps may be carried out. The preparatory steps may include mapping the surface of a substrate using a level sensor LS, measuring the position of one or more alignment markers on a substrate using an alignment sensor AS, and/or measuring a property of the projection system or projection radiation. This enables a substantial increase in the throughput of the apparatus. If the position sensor IF is not capable of measuring the position of a table while it is at the measurement station as well as at the exposure station, a second position sensor may be provided to enable the positions of the table to be tracked at both stations.

The apparatus may further include a lithographic apparatus control unit LACU which controls movements and measurements of the various actuators and sensors described. The control unit LACU may include signal processing and data processing capacity to implement desired calculations relevant to the operation of the apparatus. In practice, control unit LACU may be realized as a system of many sub-units, each handling the real-time data acquisition, processing and control of a subsystem or component within the apparatus. For example, one processing subsystem may be dedicated to servo control of the positioner PWa/PWb. Separate units may handle coarse and fine actuators, or different axes. A unit might be dedicated to the readout of the position sensor IF. Overall control of the apparatus may be controlled by a central processing unit, communicating with these sub-system processing units, with operators and with other apparatuses involved in the lithographic manufacturing process.

Figure 2:
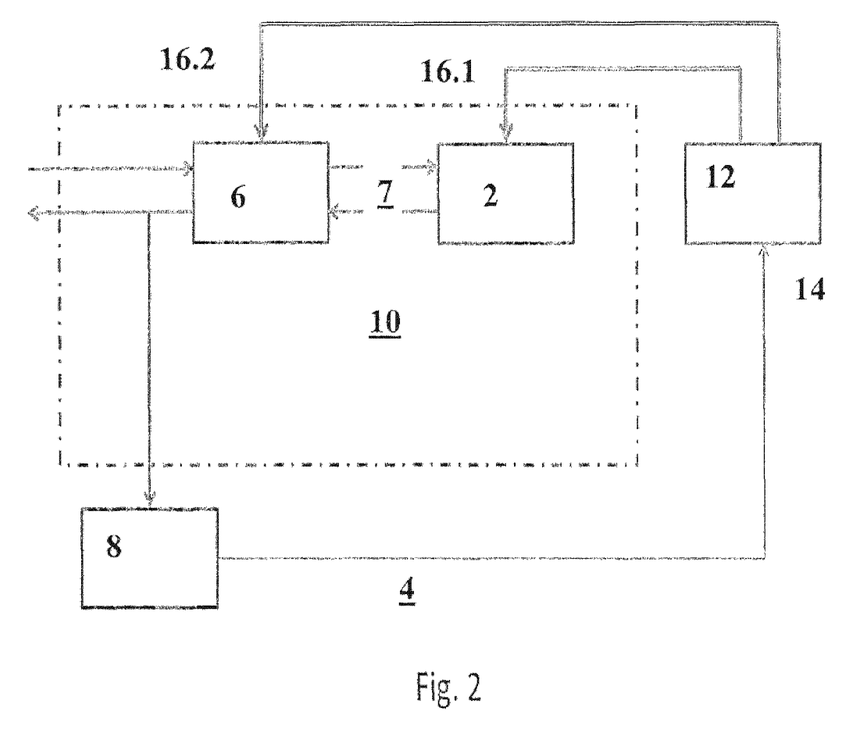
FIG. 2 is a schematic view of a lithography system comprising a machine learning controller according to an embodiment of the invention.

In FIG. 2 a lithography system 4 is shown for applying a pattern to a substrate.

The system 4 comprises a track unit 6 configured to apply a layer on the substrate for lithographic exposure. The system 4 also comprises a lithography apparatus 2 configured to expose the layer according to the pattern. In use, there is a substrate flow 7 via the track unit 6 to the lithography apparatus 2 and then back to the track unit 6 (to apply a next layer or a final treatment before exit).

The lithography apparatus 2 is described hereinbefore and is of the dual-stage type in this example. The system 4 also comprises a metrology unit 8 configured to measure a property of the exposed pattern in the layer and a control unit 10 configured to control the automatic substrate flow 7 among the track unit, the lithography apparatus, and the metrology unit. For example, the metrology unit 8 is configured to measure the overlay between exposed patterns in successive layers on a certain substrate and/or an imaging parameter of an exposed pattern in a certain layer of a certain substrate. Examples of imaging parameters include the critical dimension of the pattern (so called "CDU" of the pattern), magnification (errors) and/or distortion.

The lithography system 4 comprises a machine learning controller 12 configured to control at least part of the system 4. In this particular example the machine learning controller 12 is configured to control the track unit 6, the lithography apparatus 2 and/or the control unit 10 in order to optimize a property of the pattern. For this, the machine learning controller 12 is trained on the basis of the measured property of patterns exposed on substrates of at least two so-called lots of substrates. A "lot of substrates" comprises at least two substrates, and often between ten to thirty substrates. The measurements performed by the metrology unit 8 of the patterns of such a sequence of substrates are fed to the machine learning controller via a measurement signal 14. This measurement signal 14 allows the machine learning controller 12 to monitor system drift and to correct for this system drift. These measurements relate to "post-exposure" data which can be compared directly with the desired output result and which allows monitoring drift in an accurate way. This information may be used for an effective and accurate control of the system 4.

In the example of FIG. 2 the machine learning controller 12 is configured to generate drift control signals (16.1 and/or 16.2) on the basis of the measurement signal 14. Via drift control signal 16.1 system drift in the lithography apparatus 2 can be corrected and via drift control signal 16.2 system drift in the track unit 6 can be corrected. In a similar way a drift control signal 16.3 can be fed to the control unit 10.

In this example the machine learning controller 12 may comprise artificial intelligence for learning from data. This artificial intelligence may comprise known machine learning and data mining techniques. The machine learning controller 12 may comprise at least one algorithm selected from the following: Time Series, Neural Networks, Support Vector Machines, Principal Component Analysis, Genetic Programming, Association Rule Learning, Decision Tree Learning, and/or Inductive Logic Programming.

In an embodiment, the measurement control signal 14 may represent a property or parameter other than a measured property of a pattern exposed on a substrate. For example, measurement control signal 14 may represent a parameter or property associated with exposing the pattern of the patterning device onto a substrate. In an embodiment, the parameter or property associated with exposing the pattern of the patterning device onto a substrate may be a focus parameter or property, or a dose parameter or property, or both. Thus, in an embodiment, the machine learning controller 12 is configured to generate drift control signals (16.1 and/or 16.2) on the basis of a measurement signal 14 that represents a focus and/or dose parameter or property that relates to the exposure radiation used by the lithography apparatus to expose the substrate according to the patterning device pattern.

In an embodiment, the metrology unit 8 may comprise a focus sensor to measure a focal property or determine a focal parameter associated with exposing the pattern of the patterning device onto a substrate. Additionally or alternatively, the metrology unit 8 may comprise a dose sensor to measure a dose property or determine a dose parameter associated with exposing the pattern of the patterning device onto a substrate. In an embodiment, the focus sensor and/or dose sensor is part of the lithography apparatus 2.

Figure 3A:
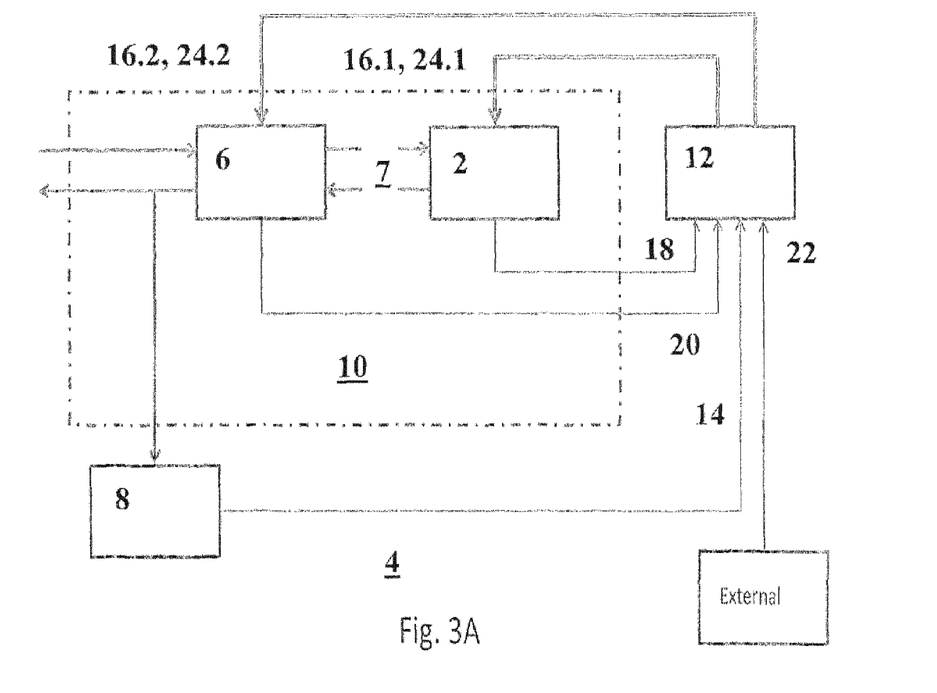
FIG. 3A is a schematic view of a lithography system comprising a machine learning controller according to an embodiment of the invention.

A further embodiment of a lithography system 4 is shown in FIG. 3A. The machine learning controller 12 is configured to generate the drift control signal(s) 16.1, 16.2 (and probably also a drift control signal 16.3, not depicted in the Figure, for controlling the control unit 10) on the basis of the measurement signal 14. In this example the drift control signals 16.1, 16.2 (probably 16.3) are also based on lithography apparatus information 18. The lithography apparatus information includes at least one selected from: information about which substrate chuck of the dual stage lithography apparatus was used for the particular substrate [where the dual stage lithography apparatus comprises two chucks for simultaneously supporting two different substrates in a measurement phase and exposure phase], information about the dynamics of the patterning device support of the lithography apparatus, information about the dynamics of the substrate stage of the lithography apparatus, information about the substrate alignment, information about the substrate leveling, information about an optical property of the projection system of the lithography apparatus and/or information about a parameter or property associated with exposing the pattern of the patterning device onto a substrate such as focus, dose and/or another parameter (in which case the measurement signal 14 may represent a measured property of patterns exposed on substrates). The mechanical (stage dynamics) and optical (lens elements) parts of the lithography suffer from wear. Generally, this occurs gradually in time and can be compensated for on the basis of a machine learning drift control signal 16.1.

In an embodiment, the machine learning controller 12 may be configured to generate the drift control signal(s) (16.1, 16.2 and/or 16.3)) on the basis of substrate process information 20. The substrate process information 20 may comprise track unit information including at least one selected from: spin coating information, baking information and/or the sequence of the substrate in the lot of substrates. In a lithography system 4 having more than one (parallel) track units 6, information about which track unit 6 treated a certain substrate with a new layer may be part of the track unit information.

In an embodiment, the machine learning controller 12 may be configured to generate the drift control signal(s) (16.1, 16.2 and/or 16.3) on the basis of plant information 22 regarding the plant where the lithographic system is housed. Plant information 22 may include environmental data comprising at least one selected from: temperature in the plant, humidity in the plant, and/or external information such as etching information.

The lithography apparatus information 18, the substrate process information 20 and the plant information 22 can be seen as "pre-exposure" information in the sense that use of this information can be made before exposure of the actual substrate. However, this information also can be used after the exposure of a substrate for substrates later in the sequence (in a "post-exposure" way) which may also be useful for drift control.

In the example of FIG. 3A the machine learning controller 12 is configured to generate a real-time control signal (24.1, 24.2 and/or 24.3) on the basis of lithography apparatus information. The real-time control signal 24.1 may be used to control the lithography apparatus 2 and the real-time control signal 24.2 may be used to control the track unit 6 (the real-time control signal 24.3 may be generated to control the unit 10). The real-time control signal 24.1 may be effective in correcting, for example, substrate-to-substrate variation: for example an alignment error for a specific substrate can be corrected before exposure in the lithography apparatus 2. The real-time control signal 24.2 may be effective for correcting, for example, a specific characteristic in the track unit 6 (as an example: when more than one substrate flow through a track unit, or through track units in parallel, is used in the lithography system 4, relevant information includes information about which track unit has been used for a substrate and which characteristic that yields to the layer in order to correct the lithography apparatus 2 for that specific substrate).

The real-time control signal (24.1, 24.2, 24.3) may be based, in addition to the lithography information, also on the measured property by the metrology unit 8 (measurement signal 14), the substrate process information 20 and/or plant information 22.

Figure 3B:
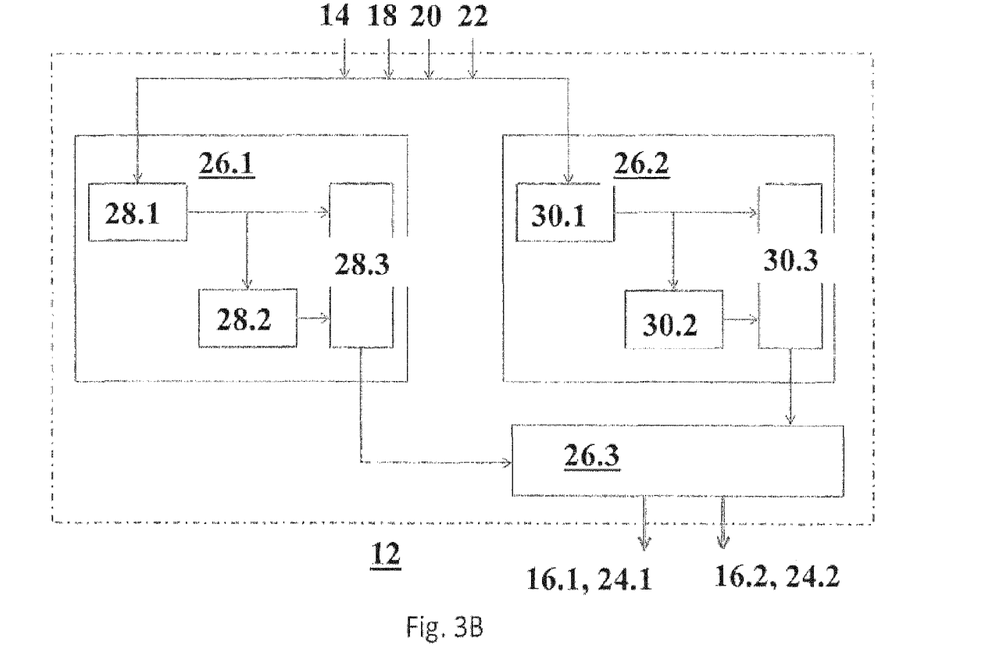
FIG. 3B is a schematic view of a machine learning controller according to an embodiment of the invention for a lithography system.

In FIG. 3B a machine learning controller 12 is shown which can be used in a lithography system 4. In this particular example, an accurate edge-to-edge control is described which is desirable in complementary lithography where one-dimensional grating lines are exposed with immersion lithography and the two-dimensional shape is generated by putting so-called "cuts" on these lines to define line ends.

In the example of FIG. 3B, the machine learning controller 12 is configured to generate edge-to-edge control signals (16.1, 24.1, 16.2, 24.2) which are combinations of the overlay and critical dimension control signals generated by respectively a first controller (26.1) and a second controller (26.2). The lithography apparatus 2 is controlled with the edge-to-edge control signals (16.1, 24.1) and the track unit 6 is controlled with the edge-to-edge control signals (16.2, 24.2). The machine learning controller 12 is also capable of controlling the control unit 14 with edge-to-edge control signals (16.3, 24.3).

The signals 16.1, 16.2 (16.3) are drift control signal and the signals 24.1, 24.2 (24.3) are real-time control signals. The generated control signals are based on measurement signal 14, lithography information 18, substrate process information 20 and/or plant information 22.

The first controller 26.1 comprises a first sub-controller 28.1 configured to generate a drift overlay control signal and a second sub-controller 28.2 configured to generate a real-time overlay control signal. The second sub-controller 26.2 comprises a third sub-controller 30.1 configured to generate a drift critical dimension control signal and a fourth sub-controller 30.2 configured to generate a real-time critical dimension control signal.

Furthermore, the machine learning controller comprises an estimation unit 28.3 configured to generate an overlay prediction signal and an estimation unit 30.3 configured to generate a critical dimension prediction signal. The overlay prediction signal and the critical dimension signal are fed to the edge-to-edge controller 26.3 for generating edge-to-edge control signals (16.1, 24.1, 16.2, 24.2) as described hereinbefore (thus in this example there are both a drift edge-to-edge control signal and real-time edge-to-edge control signal).

In an embodiment, the edge-to-edge control signals (16.1, 24.1, 16.2, 24.2) may include another signal representing another parameter. For example, the other parameter may be another imaging parameter, such as a focus parameter. In an embodiment, the edge-to-edge error control signal may involve a different combination of imaging parameters. For example, the edge-to-edge control signal may comprise a combination of the mentioned overlay control signal and another imaging parameter such as a focus parameter. Or, the edge-to-edge control signal may comprise a combination of the mentioned critical dimension signal and another imaging parameter such as a focus parameter.

In an embodiment, reference herein to machine learning controller 12 being configured to control the track unit 6, the lithography apparatus 2 and/or the control unit 10 may include control of one or more specific devices within the track unit 6, the lithography apparatus 2 and/or the control unit 10, and/or include control of one or more specific devices in the lithography system 4 that are outside, but associated with, the track unit 6, the lithography apparatus 2 and/or the control unit 10, or both. For example, the machine learning controller 12 may adjust the radiation source SO in, or associated with, the lithography apparatus 2. Thus, in an embodiment, the machine learning controller 12 adjusts radiation source SO used to generate the exposure radiation, which adjustment may include adjusting the focus and/or dose of the exposure radiation. Thus, in an embodiment, the radiation source SO (whether included in the lithography apparatus or associated with the lithography apparatus) may have the machine learning controller 12 or have a controller operable with the machine learning controller 12.

The controllers described herein may each or in combination be operable when one or more computer programs are read by one or more computer processors located within at least one component of the lithographic system. The controllers may each or in combination have any suitable configuration for receiving, processing, and sending signals. One or more processors are configured to communicate with the at least one of the controllers. For example, each controller may include one or more processors for executing computer programs that include machine-readable instructions for one or more of the methods described above. The controllers may include data storage medium configured to store such computer programs, and/or hardware to receive such a medium. So the controller(s) may operate according to the machine readable instructions of one or more computer programs.

An embodiment may take the form of a computer program containing one or more sequences of machine-readable instructions describing a method as disclosed above, or a data storage medium (e.g. semiconductor memory, magnetic or optical disk) having such a computer program stored therein.

The invention claimed is:

1. A lithography system configured to apply a pattern to a substrate, comprising:
   a track unit configured to apply a layer on the substrate for lithographic exposure;
   a lithography apparatus configured to expose the layer according to the pattern;
   a metrology unit configured to measure a property of the exposed pattern in the layer and/or measure a property associated with exposing the pattern onto the substrate;
   a control unit configured to control an automatic substrate flow among the track unit, the lithography apparatus, and the metrology unit; and
   a machine learning controller configured to control the lithography system to optimize a property of the pattern, the machine learning controller configured to be trained on the basis of the measured property and to correct lithography system drift by adjusting one or more selected from: the lithography apparatus, the track unit and/or the control unit.

2. A lithography system configured to apply a pattern to a substrate, the system comprising:
   a lithography apparatus configured to expose a layer of the substrate according to the pattern; and
   a machine learning controller configured to control the lithography system to optimize a property of the pattern, the machine learning controller configured to be trained on the basis of a property measured by a metrology unit configured to measure a property of the exposed pattern in the layer and/or a property associated with exposing the pattern onto the substrate, and to correct lithography system drift by adjusting one or more selected from: the lithography apparatus, a track unit configured to apply the layer on the substrate for lithographic exposure, and/or a control unit configured to control an automatic substrate flow among the track unit, the lithography apparatus, and the metrology unit.

3. The lithography system according to claim 2, further comprising:
   the track unit configured to apply the layer on the substrate for lithographic exposure;
   the metrology unit configured to measure the property of the exposed pattern in the layer; and
   the control unit configured to control the automatic substrate flow among the track unit, the lithography apparatus, and the metrology unit.

4. The lithography system according to claim 2, wherein the lithography system drift comprises at least lithography apparatus drift, track unit drift, control unit drift, and/or metrology unit drift.

5. The lithography system according to claim 2, wherein the machine learning controller is configured to be trained on the basis of at least two lots of substrates.

6. The lithography system according to claim 2, wherein the machine learning controller comprises a first controller configured to control overlay between pattern layers and/or a second controller configured to control a critical dimension of the pattern.

7. The lithography system according to claim 6, wherein the machine learning controller comprises both the first and second controller, wherein the first controller comprises a first sub-controller configured to generate a first drift control signal for a pattern overlay, wherein the second controller comprises a third sub-controller configured to generate a second drift control signal for a critical dimension of the pattern, and wherein the machine learning controller is configured to generate an edge-to-edge placement signal which is a combination of the first and second drift control signals.

8. The lithography system according to claim 7, wherein the edge-to-edge placement signal is a warning signal, and wherein the machine learning controller is configured to control the lithography apparatus, track unit and/or control unit on the basis of the warning signal if it exceeds a threshold level.

9. The lithography system according to claim 8, wherein the edge-to-edge placement signal is a third drift control signal, wherein the machine learning controller is configured to control the lithography apparatus, track unit and/or control unit with the third drift control signal.

10. The lithography system according to claim 7, wherein the machine learning controller is configured to deduce at least one of the drift control signals from the measured property and to correct the lithography system for drift by adjusting the lithography apparatus, track unit and/or control unit with the deduced drift control signal.

11. The lithography system according to claim 10, wherein the machine learning controller is configured to deduce the at least one drift control signal also on the basis of lithography apparatus information, the lithography apparatus information including at least one selected from: information about a substrate chuck of the lithography apparatus used for exposure, information about the dynamics of a patterning device support of the lithography apparatus, information about the dynamics of a substrate stage of the lithography apparatus, information about substrate alignment, information about substrate leveling, information about an optical property of a projection system of the lithography apparatus, and/or information about a parameter or property associated with exposing the pattern of the patterning device onto a substrate.

12. The lithography system according to claim 10, wherein the machine learning controller is configured to deduce the at least one drift control signal also on the basis of substrate process information, the substrate process information including at least one selected from: spin coating information, baking information, etching information and/or the sequence of the substrate in the lot of substrates.

13. The lithography system according to claim 10, wherein the machine learning controller is configured to deduce the at least one drift control signal also on the basis of plant information regarding the plant housing the lithography system, the plant information including environmental data comprising at least one selected from: temperature in the plant and/or humidity in the plant.

14. The lithography system according to claim 10, wherein the first controller comprises a second sub-controller configured to deduce a real-time overlay control signal and the second controller comprises a fourth sub-controller configured to deduce a real-time critical dimension control signal, wherein the real-time control signals are based on lithography apparatus information including at least one selected from: information about a substrate chuck of the lithography apparatus used for exposure, information about the dynamics of a patterning device support of the lithography apparatus, information about the dynamics of a substrate stage of the lithography apparatus, information about substrate alignment, information about substrate leveling, information about an optical property of a projection system of the lithography apparatus and/or information about a parameter or property associated with exposing the pattern of the patterning device onto a substrate, wherein the real-time control signals correspond to substrate-to-substrate lithography system variation, and wherein the machine learning controller is configured to correct the lithography apparatus, track unit and/or control unit for the substrate-to-substrate lithography system variation with the real-time control signals, and wherein the machine learning controller is configured to deduce the real-time control signals also on the basis of the measured property.

15. A machine learning controller for use in a lithography system, the machine learning controller configured to control the lithography system to optimize a property of a pattern to be exposed on a substrate, the machine learning controller configured to be trained on the basis of a property measured by a metrology unit configured to measure a property of the exposed pattern in the layer and/or a property associated with exposing the pattern onto the substrate, and to correct lithography system drift by adjusting one or more selected from: a lithography apparatus configured to expose a layer of the substrate according to the pattern, a track unit configured to apply the layer on the substrate for lithographic exposure, and/or a control unit configured to control an automatic substrate flow among the track unit, the lithography apparatus, and the metrology unit.

16. The machine learning controller according to claim 15, wherein the lithography system drift comprises at least lithography apparatus drift, track unit drift, control unit drift, and/or metrology unit drift.

17. The machine learning controller according to claim 15, wherein the machine learning controller is configured to be trained on the basis of at least two lots of substrates.

18. The machine learning controller according to claim 15, wherein the machine learning controller comprises a first controller configured to control overlay between pattern layers and/or a second controller configured to control a critical dimension of the pattern.

19. The machine learning controller according to claim 18, wherein the machine learning controller comprises both the first and second controller, wherein the first controller comprises a first sub-controller configured to generate a first drift control signal for a pattern overlay, wherein the second controller comprises a third sub-controller configured to generate a second drift control signal for a critical dimension of the pattern, and wherein the machine learning controller is configured to generate an edge-to-edge placement signal which is a combination of the first and second drift control signals.

20. The machine learning controller according to claim 19, wherein the edge-to-edge placement signal is a warning signal, and wherein the machine learning controller is configured to control the lithography apparatus, track unit and/or control unit on the basis of the warning signal if it exceeds a threshold level.

21. The machine learning controller according to claim 19, wherein the machine learning controller is configured to deduce at least one of the drift control signals from the measured property and to correct the lithography system for drift by adjusting the lithography apparatus, track unit and/or control unit with the deduced drift control signal.

* * * * *